US006882581B2

(12) United States Patent
Yoneyama

(10) Patent No.: US 6,882,581 B2
(45) Date of Patent: Apr. 19, 2005

(54) SEMICONDUCTOR INTEGRATED CIRCUIT CAPABLE OF SELECTING LINES OF DATA BUS TO WHICH DATA IS INPUT WHEN THE NUMBER OF BITS OF INPUT DATA IS DIFFERENT FROM THE NUMBER OF BITS OF THE DATA BUS

(75) Inventor: Tsuyoshi Yoneyama, Fujimi-machi (JP)

(73) Assignee: Seiko Epson Corporation (JP)

( * ) Notice: Subject to any disclaimer, the term of this patent is extended or adjusted under 35 U.S.C. 154(b) by 56 days.

(21) Appl. No.: 10/647,063

(22) Filed: Aug. 22, 2003

(65) Prior Publication Data

US 2004/0105337 A1 Jun. 3, 2004

(30) Foreign Application Priority Data

Aug. 29, 2002 (JP) ....................................... 2002-251220

(51) Int. Cl.[7] ................................................ G11C 16/04
(52) U.S. Cl. .............................. 365/189.05; 365/230.02
(58) Field of Search ........................ 365/189.05, 230.02

(56) References Cited

U.S. PATENT DOCUMENTS 5,530,824 A * 6/1996 Peng et al. ............ 365/189.02
5,663,924 A * 9/1997 Barth et al. ............ 365/230.03
5,748,547 A * 5/1998 Shau ..................... 365/230.03
5,963,497 A * 10/1999 Holland ................ 365/189.04
6,711,041 B1 * 3/2004 Pereira et al. ......... 365/230.03

* cited by examiner

*Primary Examiner*—Michael S. Lebentritt
*Assistant Examiner*—Tuan T. Nguyen
(74) *Attorney, Agent, or Firm*—Harness, Dickey & Pierce, P.L.C.

(57) ABSTRACT

A semiconductor integrated circuit is provided which is capable of selecting lines of a data bus to which data is input when the number of bits of input data is different from the number of bits of the data bus with which to input data to be written into a RAM. The semiconductor integrated circuit comprises K-bit data bus lines D0 to D7 (K is an integer 2 or more) to which data is input; selection circuits SEL (0) to SEL (13) for selecting data input through an N number of the data bus lines on the high bit side or through an N number of the data bus lines on the low bit side based on a set signal when N-bit data is input into the data bus lines (N is an integer smaller than K); and a random access memory (RAM) 1 for storing data selected by the selection circuit.

3 Claims, 4 Drawing Sheets

| P2 | P1 | P0 | M | D7 | D6 | D5 | D4 | D3 | D2 | D1 | D0 |
|---|---|---|---|---|---|---|---|---|---|---|---|
| 0 | 0 | 1 | 0 | R0 | * | * | * | * | * | * | * |
| | | | 1 | * | * | * | * | * | * | * | R0 |
| 0 | 1 | 0 | 0 | R1 | R0 | * | * | * | * | * | * |
| | | | 1 | * | * | * | * | * | * | R1 | R0 |
| 0 | 1 | 1 | 0 | R2 | R1 | R0 | * | * | * | * | * |
| | | | 1 | * | * | * | * | * | R2 | R1 | R0 |
| 1 | 0 | 0 | 0 | R3 | R2 | R1 | R0 | * | * | * | * |
| | | | 1 | * | * | * | * | R3 | R2 | R1 | R0 |
| 1 | 0 | 1 | 0 | R4 | R3 | R2 | R1 | R0 | * | * | * |
| | | | 1 | * | * | * | R4 | R3 | R2 | R1 | R0 |
| 1 | 1 | 0 | 0 | R5 | R4 | R3 | R2 | R1 | R0 | * | * |
| | | | 1 | * | * | R5 | R4 | R3 | R2 | R1 | R0 |
| 1 | 1 | 1 | 0 | R6 | R5 | R4 | R3 | R2 | R1 | R0 | * |
| | | | 1 | * | R6 | R5 | R4 | R3 | R2 | R1 | R0 |
| 0 | 0 | 0 | 0 | R7 | R6 | R5 | R4 | R3 | R2 | R1 | R0 |
| | | | 1 | R7 | R6 | R5 | R4 | R3 | R2 | R1 | R0 |

FIG. 2

| lines of a data bus | D7 | D6 | D5 | D4 | D3 | D2 | D1 | D0 |
|---|---|---|---|---|---|---|---|---|
| data | R4 | R3 | R2 | R1 | R0 | * | * | * |

FIG. 4

SEMICONDUCTOR INTEGRATED CIRCUIT CAPABLE OF SELECTING LINES OF DATA BUS TO WHICH DATA IS INPUT WHEN THE NUMBER OF BITS OF INPUT DATA IS DIFFERENT FROM THE NUMBER OF BITS OF THE DATA BUS

BACKGROUND OF THE INVENTION

1. Technical Field

The present invention generally relates to a semiconductor integrated circuit with a built-in RAM, and more particularly to a semiconductor integrated circuit (LCD driver) that writes input data into a RAM and drives an LCD based on data read out from the RAM.

2. Related Art

In an LCD driver of the prior art, when the number of bits of input data is fewer than that of bits of a data bus with which to input data to be written into a RAM from an MPU, data is allotted to the high bit side lines of the data bus. FIG. 4 shows the relation between the data bus and data in the LCD driver of the prior art. Here, the number of the data bus is 8 bits while that of data is 5 bits.

As shown in FIG. 4, in the LCD driver of the prior art, 5-bit data R4 to R0 are supplied to high 5-bit lines D7 to D3 of 8-bit lines D7 to D0 included in the data bus. Here, since data corresponding to the low 3-bit lines D2 to D0 is not to be stored in the RAM, it is denoted with an '*' as dummy data.

However, it may be necessary to provide a RAM with data allotted to the low bit side lines of a data bus depending on a customers' specifications, and also the number of bits of data differs. Thus, it has been required to change the layout of an LCD driver for each case.

In light of the above problem, the present invention intends to provide a semiconductor integrated circuit capable of selecting lines of a data bus to which data is input when the number of bits of input data is different from that of bits of the data bus with which to input data to be written into a RAM.

SUMMARY

In order to solve the above discussed problems, the semiconductor integrated circuit according to the present invention comprises a K-bit (K is an integer 2 or more) data bus to which data is input; a selection circuit for selecting data input through an N number of lines on a high bit side or through an N number of lines on a low bit side of the data bus in accordance with a set signal when N-bit data (N is an integer smaller than K) is input to the data bus; and a random access memory (RAM) for storing data selected by the selection circuit.

Here, the selection circuit may comprise a first selection circuit for selecting a plurality of bits from the input N-bit data in accordance with a signal which is set in response to the number of N bits of the input data; and a second selection circuit for selecting an N number of bits from the plurality of bits output from the first selection circuit and supplying the bits to the RAM in accordance with a signal which is set so as to correspond to any desired one of the high bit side lines and/or the low bit side lines of the data bus.

Alternatively, the selection circuit may comprise a first selection circuit for selecting data input either through a plurality of lines on the high bit side or through a plurality of lines on the low bit side of the data bus in accordance with a signal which is set so as to correspond to any desired one of the high bit side lines and the low bit side lines of the data bus; and a second selection circuit for selecting an N number of bits from data output from the first selection circuit and supplying the bits to the RAM according to a signal which is set in response to the number of N bits of the input data.

According to this invention, in a semiconductor integrated circuit with a built-in RAM, when the number of bits of input data is different from the number of bits of a data bus with which input data id written into the RAM, it is possible to select lines of a data bus to which data is input.

BRIEF DESCRIPTION OF DRAWINGS

FIG. 2 is a drawing showing data corresponding to data bus lines D0 to D7.

FIG. 4 shows the relation between a data bus and data in an LCD driver of the prior art.

DETAILED DESCRIPTION

Figure 1:
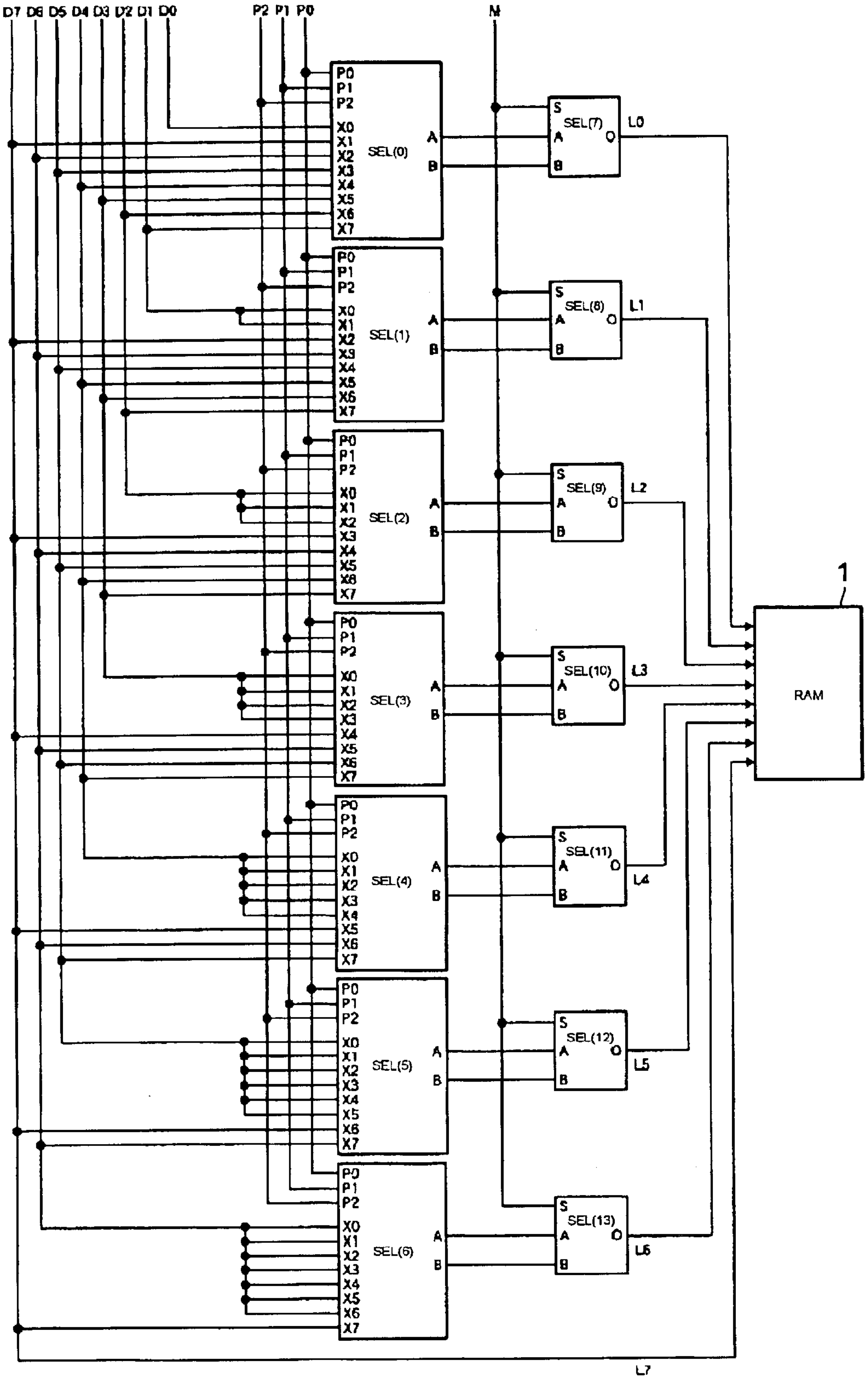
FIG. 1 is a drawing showing a configuration of a semiconductor integrated circuit according to the first embodiment of the present invention.

Embodiments of the invention are explained below with reference to the drawings. Here, the same constituent elements are denoted with the same reference numerals, and repeated explanation thereof is omitted.

FIG. 1 shows a configuration of a semiconductor integrated circuit according to the first embodiment of the invention. As shown in FIG. 1, the semiconductor integrated circuit comprises 8-bit data bus lines D0 to D7 with which to input data from an MPU; selectors SEL (0) to SEL (6) each of which selects 2 bits from an arbitrary number of bits of data input to the data bus lines D0 to D7; selectors SEL (7) to SEL (13) each of which selects 1 bit from the 2 bits selected by corresponding one of the selectors SEL (0) to SEL (6); and a RAM 1 for storing data supplied thereto from the selectors SEL (7) to SEL (13) through 8-bit data lines L0 to L7.

Then, in response to the number of bits of input data, the number of bits setting signals P0 to P2 are set to high or low level. Expressing the values of the number of bits setting signals P0 to P2 with '1' or '0', the signals P0 to P2 are set such that $N=(P2 \cdot 2^2+P1 \cdot 2+P0)$ when ordinarily N-bit data is input. For example, the signals are set such that (P2, P1, P0)=(0,0,1) when 1-bit input data R0 is input; (P2, P1, P0)=(0, 1, 0) when 2-bit input data R1 and R0 are input; and (P2, P1, P0)=(1, 1, 1) when 7-bit input data R6 to R0 are input. However, when 8-bit input data R7 to R0 are input, the signals are set such that (P2, P1, P0)=(0, 0, 0).

Each of the selectors SEL (0) to SEL (6) outputs data input to an input terminal X0 from an output terminal B and selects data to be input to an input terminal XN from data input to input terminals X0 to X7 based on the bit number setting signals P0 to P2 so as to output it from an output terminal A. Here, $N=(P2 \cdot 2^2+P1 \cdot 2+P0)$.

Each of the selectors SEL (7) to SEL (13) selects data based on a mode signal M such that it selects data input through an input terminal A when M=0 but selects data input through an input terminal B when M=1, and then outputs that data from an output terminal O. The mode signal M indicates either that input data is allotted to the high bit side lines of the data bus or that it is allotted to the low bit side lines of the data bus when data is input from the MPU. When M=0, this shows that data is input through the lines on the high bit side of the data bus D0 to D7, and when M=1, this shows that data is input through the lines on the low bit side of the data bus D0 to D7.

The RAM 1 stores data output from the selectors SEL (7) to SEL (13). In this regard, however, the RAM 1 stores data output from an N number ($N=(P2\cdot 2^2+P1\cdot 2+P0)$) of upper-side selectors of the selectors SEL (7) to (13) while not storing data output from the other selectors.

Next, operation of the semiconductor integrated circuit of the embodiment is explained with reference to FIG. 2. FIG. 2 shows data at the data bus lines D0 to D7. Here, symbols '*' show dummy data.

When input data is allotted to the low bit side of the data bus (M=1), the selector SEL (0) outputs data R0 input to the input terminal X0 from the output terminal B. Moreover, when input data is allotted the high bit side of the data bus (M=0), the selector SEL (0) outputs data from the output terminal A as follows: the selector outputs data R0 input to the input terminal X0 when (P2, P1, P0)=(0, 0, 0); outputs data R0 input to the input terminal X1 when (P2, P1, P0)=(0, 0, 1); outputs data R0 input to the input terminal X2 when (P2, P1, P0)=(0, 1, 0); outputs data R0 input to the input terminal X3 when (P2, P1, P0)=(0, 1, 1); outputs data R0 input to the input terminal X4 when (P2, P1, P0)=(1, 0, 0); outputs data R0 input to the input terminal X5 when (P2, P1, P0)=(1, 0, 1); outputs data R0 input to the input terminal X6 when (P2, P1, P0)=(1, 1, 0); and outputs data R0 input to the input terminal X7 when (P2, P1, P0)=(1, 1, 1). On the other hand, the selector SEL (7) selects data output from the output terminal A of the selector SEL (0) when M=0 but selects data output from the output terminal B of the selector SEL (0) when M=1, and then outputs that data to the data line L0.

The selector SEL (1) outputs data R1 input to the input terminal X0 from the output terminal B when input data is allotted to the data bus lines on the low bit side (M=1). Furthermore, when input data is allotted to the data bus lines on the high bit side (M=0), the selector SEL (1) outputs data from the output terminal A as follows: the selector outputs data R1 input to the input terminal X1 when (P2, P1, P0)=(0, 0, 0); outputs data R1 input to the input terminal X2 when (P2, P1, P0)=(0, 1, 0); outputs data R1 input to the input terminal X3 when (P2, P1, P0)=(0, 1, 1); outputs data R1 input to the input terminal X4 when (P2, P1, P0)=(1, 0, 0); outputs data R1 input to the input terminal X5 when (P2, P1, P0)=(1, 0, 1); outputs data R1 input to the input terminal X6 when (P2, P1, P0)=(1, 1, 0); and outputs data R1 input to the input terminal X7 when (P2, P1, P0)=(1, 1, 1). On the other hand, the selector SEL (8) selects data output from the output terminal A of the selector SEL (1) when M=0 but selects data output from the output terminal B of the selector SEL (1) when M=1, and then outputs that data to the data line L1.

The selector SEL (2) outputs data R2 input to the input terminal X0 from the output terminal B when input data is allotted to the data bus lines on the low bit side (M=1). Furthermore, when input data is allotted to the data bus lines on the high bit side (M=0), the selector SEL (2) outputs data from the output terminal A as follows: the selector outputs data R2 input to the input terminal X2 when (P2, P1, P0)=(0, 0, 0); outputs data R2 input to the input terminal X3 when (P2, P1, P0)=(0, 1, 1); outputs data R2 input to the input terminal X4 when (P2, P1, P0)=(1, 0, 0); outputs data R2 input to the input terminal X5 when (P2, P1, P0)=(1, 0, 1); outputs data R2 input to the input terminal X6 when (P2, P1, P0)=(1, 1, 0); and outputs data R2 input to the input terminal X7 when (P2, P1, P0)=(1, 1, 1). On the other hand, the selector SEL (9) selects data output from the output terminal A of the selector SEL (2) when M=0 but selects data output from the output terminal B of the selector SEL (2) when M=1, and then outputs that data to the data line L2.

The selector SEL (3) outputs data R3 input to the input terminal X0 from the output terminal B when input data is allotted to the data bus lines on the low bit side (M=1). Furthermore, when input data is allotted to the data bus lines on the high bit side (M=0), the selector SEL (3) outputs data from the output terminal A as follows: the selector outputs data R3 input to the input terminal X3 when (P2, P1, P0)=(0, 0, 0); outputs data R3 input to the input terminal X4 when (P2, P1, P0)=(1, 0, 0); outputs data R3 input to the input terminal X5 when (P2, P1, P0)=(1, 0, 1); outputs data R3 input to the input terminal X6 when (P2, P1, P0)=(1, 1, 0); and outputs data R3 input to the input terminal X7 when (P2, P1, P0)=(1, 1, 1). On the other hand, the selector SEL (9) selects data output from the output terminal A of the selector SEL (2) when M=0 but selects data output from the output terminal B of the selector SEL (2) when M=1, and then outputs that data to the data line L2 of the data bus. In addition, the selector SEL (10) selects data output from the output terminal A of the selector SEL (3) when M=0 but selects data output from the output terminal B of the selector SEL (3) when M=1, and then outputs that data to the data line L3.

The selector SEL (4) outputs data R4 input to the input terminal X0 from the output terminal B when input data is allotted to the data bus lines on the low bit side (M=1). Furthermore, when input data is allotted to the data bus lines on the high bit side (M=0), the selector SEL (4) outputs data from the output terminal A as follows: the selector outputs data R4 input to the input terminal X4 when (P2, P1, P0)=(0, 0, 0); outputs data R4 input to the input terminal X5 when (P2, P1, P0)=(1, 0, 1); outputs data R4 input to the input terminal X6 when (P2, P1, P0)=(1, 1, 0); and outputs data R4 input to the input terminal X7 when (P2, P1, P0)=(1, 1, 1). On the other hand, the selector SEL (11) selects data output from the output terminal A of the selector SEL (4) when M=0 but selects data output from the output terminal B of the selector SEL (4) when M=1, and then outputs that data to the data line L4.

The selector SEL (5) outputs data R5 input to the input terminal X0 from the output terminal B when input data is allotted to the data bus lines on the low bit side (M=1). Furthermore, when input data is allotted to the data bus lines on the high bit side (M=0), the selector SEL (5) outputs data from the output terminal A as follows: the selector outputs data R5 input to the input terminal X5 when (P2, P1, P0)=(0, 0, 0); outputs data R5 input to the input terminal X6 when (P2, P1, P0)=(1, 1, 0); and outputs data R5 input to the input terminal X7 when (P2, P1, P0)=(1, 1, 1). On the other hand, the selector SEL (12) selects data output from the output terminal A of the selector SEL (5) when M=0 but selects data output from the output terminal B of the selector SEL (5) when M=1, and then outputs that data to the data line L5.

The selector SEL (6) outputs data R6 input to the input terminal X0 from the output terminal B when input data is allotted to the data bus lines on the low bit side (M=1). Furthermore, when input data is allotted to the data bus lines on the high bit side (M=0), the selector SEL (6) outputs data from the output terminal A as follows: the selector outputs data R6 input to the input terminal X6 when (P2, P1, P0)=(0, 0, 0); and outputs data R6 input to the input terminal X7 when (P2, P1, P0)=(1, 1, 1). On the other hand, the selector SEL (13) selects data output from the output terminal A of the selector SEL (6) when M=0 but selects data output from the output terminal B of the selector SEL (6) when M=1, and then outputs that data to the data line L6.

The RAM 1 stores data output through the selectors SEL (7) to SEL (13) and then through the data lines L0 to L6 as well as data output through the data line L7.

As described above, N-bit data (N is an integer smaller than K) is input through K-bit data bus lines (K is an integer 2 or more). When M=0, the RAM1 can be provided with data input through the N number of lines of the data bus on the high bit side, and when M=1, the RAM1 can be provided with data input through the N number of lines of the data bus on the low bit side.

Next, the second embodiment of the invention is explained.

Figure 3:
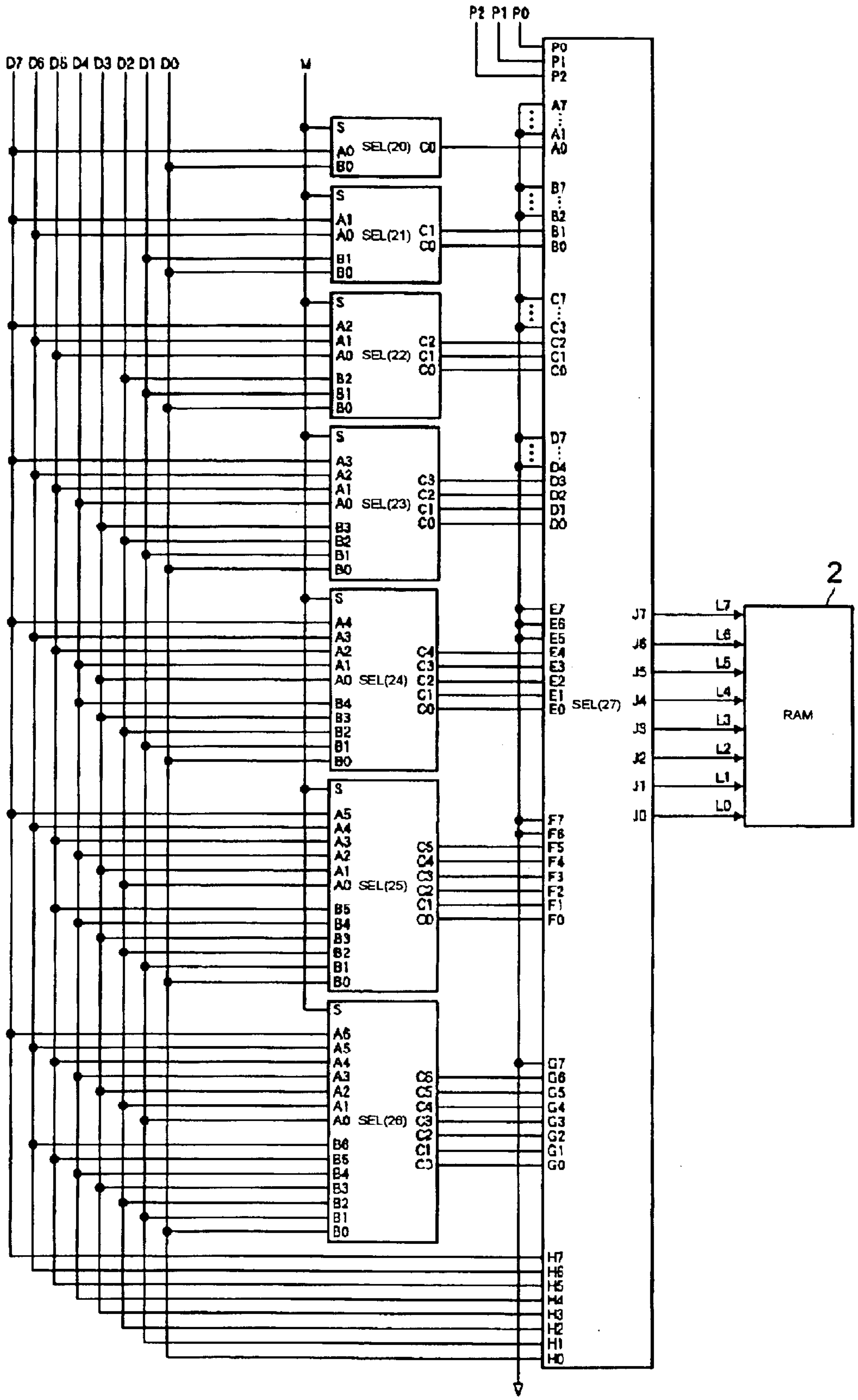
FIG. 3 is a drawing showing a configuration of a semiconductor integrated circuit according to the second embodiment of the invention.

FIG. 3 shows a configuration of a semiconductor integrated circuit according to the second embodiment of the invention. As shown in FIG. 3, this semiconductor integrated circuit comprises: the 8-bit data bus lines D0 to D7 with which to input data from the MPU; selectors SEL (20) to SEL (26) each of which selects a predetermined number of bits from data with an arbitrary number of bits input to the data bus lines D0 to D7; a selector SEL (27) for selecting a required number of bits from the predetermined number of bits selected by each of the selectors SEL (20) to SEL (26) and from the total bits of data input to the data bus lines D0 to D7; and a RAM2 for storing data supplied thereto from the selector SEL (27) through the 8-bit data lines L0 to L7.

In this embodiment, the selectors SEL (20) to SEL (26) are installed corresponding to the number of bits 1 to 7 of input data, and each of the selectors selects a corresponding number of bits of input data on the high bit side or on the low bit side according to the mode signal M. On the other hand, based on the number of bits set by the number of bits $N=(P2 \cdot 2^2+P1 \cdot 2+P0)$ of setting signals P0 to P2, the selector SEL (27) selects data output from a selector or selectors of the selectors SEL (20) to SEL (26), the selector or selectors corresponding to the number of bits of input data.

When M=0, each of the selectors SEL (20) to SEL (26) selects data through input terminals A0, A1, . . . but selects data input through input terminals B0, B1, . . . when M=1, and then outputs that data to output terminals C0, C1, . . . . Here, the mode signal M indicates either that input data is allotted to the data bus lines on the high bit side or that it is allotted to the data bus lines on the low bit side when data is input from the MPU. When M=0, it shows that data is input through the lines on the high bit side of the data bus lines D0 to D7, and when M=1, it shows that data is input through the lines on the lower bit side of the data bus lines D0 to D7.

The selector SEL (27) receives data output from the selector SEL (20) at its input terminal A0; data output from the selector SEL (21) through its input terminals B0 and B1; data output from the selector SEL (22) through its input terminals C0 to C2; data output from the selector SEL (23) through its input terminal D0 to D3; data output from the selector SEL (24) through its input terminals E0 to E4; data output from the selector SEL (25) through its input terminals F0 to F5; data output from the selector SEL (26) through its input terminals G0 to G6; and data input to the data input lines D0 to D7 through its input terminals H0 to H7. Here, valid data to be stored in the RAM2 is not input to the input terminals A1 to A7, B2 to B7, C3 to C7, D4 to D7, E5 to E7, F6 to F7 and G7 of the selector SEL (27), so that these input terminals are grounded.

The selector SEL (27) selects one set of data from a plurality of sets of input data according to the number of bits setting signals P0 to P2 and supplies the set of data from the output terminals J0 to J7 to the data lines L0 to L7. In this embodiment, data input to the data input bus lines D0 to D7 is the same as that of FIG. 2.

Advantage of the Invention

As described above, with this invention, in a semiconductor integrated circuit with a built-in RAM, it is possible to select lines of a data bus to which data is input when the number of bits of input data is different from that of bits of a data bus with which to input data to be written into the RAM.

The entire disclosure of Japanese Patent Application No. 2002-251220 filed Aug. 29, 2002 is incorporated by reference.

What is claimed is:

1. A semiconductor integrated circuit comprising:

a K-bit (K is an integer not less than 2) data bus to which data is input;

a selection circuit selecting data input through one of an N number of lines on a high bit side and an N number of lines on a low bit side of the data bus in accordance with a set signal when N-bit data (N is an integer smaller than K) is input to the data bus; and a random access memory (RAM) storing data selected by the selection circuit.

2. The semiconductor integrated circuit according to claim 1, wherein the selection circuit further comprises:

a first selection circuit selecting a plurality of bits from the input N-bit data in accordance with a signal which is set in response to the number of N bits of the input data; and a second selection circuit selecting an N number of bits from the plurality of bits output from the first selection circuit and supplying the bits to the RAM in accordance with a signal which is set so as to correspond to any desired one of the high bit side lines and the low bit side lines of the data bus.

3. The semiconductor integrated circuit according to claim 1, wherein the selection circuit further comprises:

a first selection circuit selecting data input through one of a plurality of lines on the high bit side and a plurality of lines on the low bit side of the data bus in accordance with a signal which is set so as to correspond to any desired one of the high bit side lines and the low bit side lines of the data bus; and a second selection circuit selecting an N number of bits from data output from the first selection circuit and supplying the bits to the RAM according to a signal which is set in response to the number of N bits of the input data.

* * * * *